United States Patent [19]

Gordon

[11] Patent Number: 4,585,674
[45] Date of Patent: Apr. 29, 1986

[54] METHOD FOR CONTINUOUS COATING OF GLASS

[76] Inventor: Roy G. Gordon, 22 Highland St., Cambridge, Mass. 02138

[21] Appl. No.: 704,609

[22] Filed: Feb. 25, 1985

Related U.S. Application Data

[60] Division of Ser. No. 521,675, Aug. 10, 1983, Pat. No. 4,524,718, which is a continuation-in-part of Ser. No. 443,340, Nov. 22, 1982, abandoned.

[51] Int. Cl.$^4$ .............................................. C23C 16/40
[52] U.S. Cl. .................................... 427/255; 427/166; 427/255.2; 427/255.5
[58] Field of Search ...................... 427/166, 255, 255.3, 427/255.5, 314, 255.2; 118/718, 715

[56] References Cited

U.S. PATENT DOCUMENTS

| | | | |
|---|---|---|---|
| 2,953,483 | 9/1960 | Torok | 427/255 |
| 3,306,768 | 2/1967 | Peterson | 427/255.3 |
| 4,206,252 | 6/1980 | Gordon | 427/255.3 |
| 4,294,868 | 10/1981 | Kalbskopf et al. | 427/255 |
| 4,329,379 | 5/1982 | Teineu et al. | 427/166 |
| 4,476,158 | 10/1984 | Baumberger et al. | 427/155 |
| 4,508,054 | 4/1985 | Baumberger et al. | 427/255 |

Primary Examiner—Sadie L. Childs
Attorney, Agent, or Firm—Andrew F. Kehoe

[57] ABSTRACT

A process for coating a wide moving web with the product of chemical reactants first brought into contact at a point proximate the glass surface. The process comprises a primary distribution of reactants (across the width of the substrate) through a row of small apertures, then a segregation through a secondary passage to a reaction zone at the surface of the substrate. Reactant distribution pipes are advantageously positioned and shaped to form only a gradual increase in width of the reactant flow path as they enter the reaction zone.

8 Claims, 2 Drawing Figures

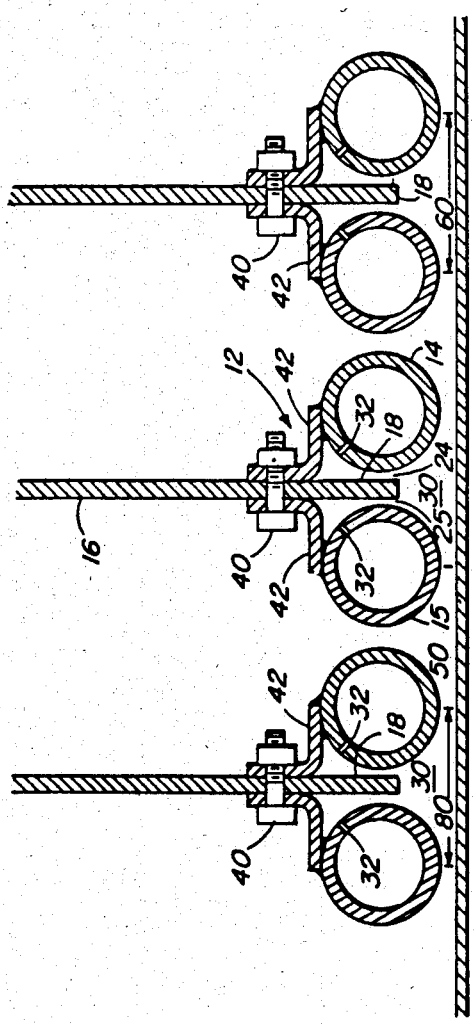
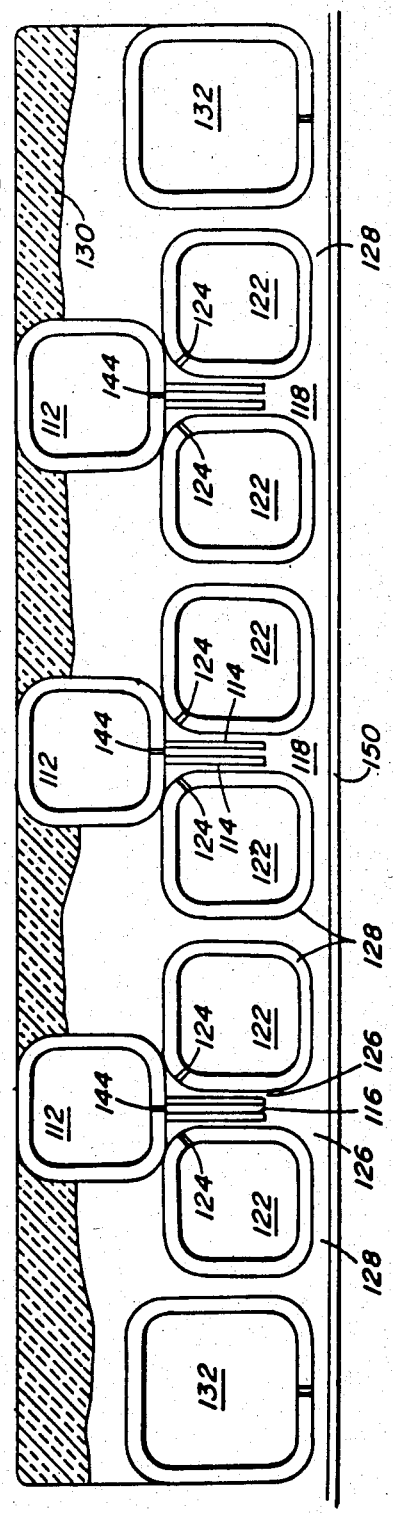

METHOD FOR CONTINUOUS COATING OF GLASS

RELATED APPLICATION

This application is a divisional of U.S. application Ser. No. 521,675 filed Aug. 10, 1983 by Roy G. Gordon entitled Reactor for Continuous Coating of Glass, U.S. Pat. No. 4,524,718, which was in turn a continuation-in-part of U.S. application Ser. No. 443,340 filed Nov. 22, 1982 by Roy G. Gordon entitled Chemical Vapor Deposition of Titanium Nitride and Like Films, now abandoned.

BACKGROUND OF THE INVENTION

This invention relates to improved process for reacting components such as tin tetrachloride and water vapor to form an optically-acceptable, haze-free coating on a hot glass surface. The invention also provides apparatus for carrying out the improved process and other such coating processes on hot substrates.

In chemical deposition of coatings on glass, it is very important to avoid premature reaction of the chemicals. Such premature reaction will often result in powder deposition on the coating apparatus, haze on the glass product and other such problems. Thus, it is necessary to carefully control the reaction time of such chemicals, where and when they are contacted with one another in relation to the glass and to the reactant-delivery system. Also, of course, the distribution of the reactant across the glass to be coated is important if one is to achieve the desired uniformity of the coating. In some applications, such accuracy is required down to very small fractions of a micron in coating thickness. Finally, it is desirable to provide coating apparatus which can be readily repaired if, through some accident, the apparatus is damaged or contaminated by the premature deposition of reaction product. All of these benefits must be achieved without unduly compromising the coating deposition rate. This is especially true of the very-thin coatings which make it possible to coat glass as it moves along a continuous production line, e.g. a float glass line.

U.S. Pat. No. 4,329,379 is representative of prior art attempts to provide tin oxide-coating processes utilizing the tin chloride/water vapor reaction procedures. One drawback of that design is that it wastes about one-third of the potential coating area. Another proposed design is that known as the Batelle/SIV coater wherein the reactants are fed through separate very narrow slots. It is more efficient than the design of U.S. Pat. No. 4,329,379 with respect to covering glass area. However, this Batelle design is not believed to be practical for continuous coating of wide glass sheets, say sheets 6–10 feet wide. One reason for this problem is the cost and difficulty maintaining the desired coating tolerances while regulating reactant feed through thin, reactant-feeder slots. Moreover, the effective coating zone is very short when utilizing such slot-moderated, reactant-feed procedures.

SUMMARY OF THE INVENTION

Therefore it is an object of the invention to provide an improved apparatus for chemical vapor depositions (CVD)-type coatings.

It is a particular object of the apparatus to provide compact apparatus which utilizes the exterior configuration of the reactant distribution tubes as means to aid distribution of reactant flow and shaping of the reactant flow and shaping of the reaction zone.

Another object of the invention is to provide an improved process for forming tin oxide coatings on a hot glass surface, particularly a surface on a float glass production facility.

Another object of the invention is to provide a process which allows relatively rapid coating deposition rates while achieving a coating of excellent optical quality.

Other objects of the invention will be obvious to those skilled in the art on reading of this disclosure.

The above objects have been substantially achieved by the discovery that careful placement of the primary reactant-distribution ports and ancillary distribution means in the coating system (a) from the glass and (b) from each other can provide important process benefits.

A particular advantage of the invention is the discovery that a relatively wide coating zone is achieved when one avoids the relatively narrow, slit-like distribution arrangements for the reaction gases and relies upon an initial, distribution from a plurality of small, spaced ports and an ancillary distribution into a reaction zone through relatively wide slots. It has been found that careful design of the reactant-supplying apparatus, so that it does not shield the glass from the reaction product, allows very substantial increases in the width of the coating zone and a consequent increase in the amount of coating that can be deposited on the glass in a given time and within a given coating zone along the float glass line.

The reactant flow rates will suitably be about 2 liters/second from each pipe, per meter of pipe.

The following is a typical composition of the reaction gas.

| Mole Percent | |
|---|---|
| 0.5 to 1% | $SnCl_4$ |
| 10 to 20% | $H_2O$ |
| 0.03 to 0.06% | HF |
| 0 to 30% | $CH_3OH$ |
| balance | nitrogen/air carrier gas |

At any given coating station, the tin chloride and its carrier gas (about 50% of the total carrier gas) will be brought into the reaction area in one tube, the other reactants are conveniently brought into the reactor in a different conduit. It has been found that the nitrogen carrier gas is best mixed with a small amount of oxygen, i.e. about 0.5 to 2% of air based on the nitrogen. Such a mixture is found to allow increased coating rate. Coating rates of above 2000 angstroms per second of glass exposure can be achieved. Thus a tin oxide coating of about 4000 angstroms (0.4 microns) can be achieved with an overall coating zone about 1 meter in length when the glass moves at 0.5 meter per second along a float glass production line. Such a 4000 angstrom coating will have an emissivity of about 0.2, i.e. a reflectivity of about 80%, at a 10 micron wavelength.

The above reactants are fairly corrosive and it is recommended that Hastelloy-type alloys, e.g. Hastelloy C-276, be selected for use in construction of the coating apparatus. These alloys are available from the High Technology Materials Division of Cabot Corporation.

It has been found that when such metals are used, the differential in coefficients of thermal expansion, between the coating apparatus and any inadvertent contamination by reaction product, is sufficiently large to facilitate the cleaning of the apparatus. On cooling, tje contaminant tends to break away from the metal surface.

Spacing of the reactor parts from the glass and from each other have been found to be important. It has been discovered that closely-spaced, smaller holes are not as convenient as somewhat larger holes spaced further apart. Fewer larger holes can achieve as efficient distribution as a large number of smaller holes and can do so at only a very small incremental distance from the sheet being coated. Moreover, the practical benefit of not having to maintain close tolerances for a large number of very small holes allows the apparatus to be assembled much less expensively and with more economical maintenance of the excellent hole-to-hole dimensional uniformity required to achieve good flow distribution of the reactants.

Typical diameter of a reactant port is about 0.15 centimeters. They are conveniently spaced about 2 to 3 centimeters from one another and are arranged, as will be seen below so that the point of mixing is about 2 centimeters from the hot glass surface being coated.

ILLUSTRATIVE EMBODIMENT OF THE INVENTION

In this application and accompanying drawings there is shown and described a preferred embodiment of the invention and suggested various alternatives and modifications thereof, but it is to be understood that these are not intended to be exhaustive and that other changes and modifications can be made within the scope of the invention. These suggestions herein are selected and included for purposes of illustration in order that others skilled in the art will more fully understand the invention and the principles thereof and will be able to modify it and embody it in a variety of forms, each as may be best suited in the condition of a particular case.

IN THE DRAWINGS

FIG. 1 illustrates, in section, three coating stages as they appear in a reactor mounted along a sheet of glass moving along a float-glass production facility.

FIG. 2, illustrates an embodiment of the invention using three inlet tubes at each coating station.

As is seen in FIG. 1, the coating apparatus 10 of the application comprises three coating heads 12, each consisting of two reactant-distribution tubes, 14 and 15, and a tube support sheet 16. Tube support sheet 16 terminates in a reactant shield member 18 which forms means to separate those reactant which have emerged from each set of tubes 14 and 15 until they emerge from passages 24 and 25, respectively to mix and react in the reaction zone 30. Passages 24 and 25 are much wider, usually 2 to 4 times, than primary reactant-distributing apertures 32. These passages form ancillary reactant-distributing means assuring a satisfactory distribution of reactants into the reaction zone.

Using flow rates suitable to achieve 4000 angstrom coatings of tin oxide, the end of the shield member 18 is suitably from about 1.5 centimeters to 2.5 centimeters preferably about 2 centimeters, from the glass surface.

Tubes 14 and 15 are welded on brackets 42 and mounted for ready removal on support sheet 16 by bolts 40. This provides a means to replace, rather than repair, bolts damaged during cleaning or maintenance.

The delivery pressure of reactants to these apertures 32 and the aperture hole size are adjusted to achieve uniform mass flow through each aperture of any one tube. This may require some slight reaming of undersized holes. These holes are spaced about 2 to 3 centimeters apart along the length of tubes 14 and 15. They are advantageously from about 0.1 to about 0.3 centimeters in diameter preferably 0.15 centimeters or larger. In the specific example apertures 32 are spaced about 0.15 centimeters in diameter. Flow rates from all holes should be closely matched prior to putting the apparatus into service. This may require some slight reaming of under sized holes.

The coating apparatus can be mounted in any convenient manner above the glass sheet being coated. Good engineering practice will ensure proper insulation from ambient of the reactant-carrying conducts leading to the apparatus and of superstructure of the glass production line from which the coating apparatus is supported.

In practice, the $H_2O$, hydrogen fluoride, nitrogen and methanol mixture is fed through tubes 14 while the tin tetrachloride and nitrogen mixture is fed through tubes 15.

The reactant mixtures maintained at 400° C. to 500° C. and Reynolds numbers of about 100 after they leave the tubes 14 and 15. It is particularly important to note that the reactant flow rate does not depend upon restriction of flow through passages 24 and 25, i.e. the ancillary distribution slots between the reactant feed tubes and the shield member 18. Moreover, the primary distribution of the flow does not depend on flow through these passages which are relatively wide, about 0.3 centimeters (or, defined more broadly about 2 to 4 times, preferably about three times the diameter 20 of the aperture 32). However, passages 24 and 25 play a major role in evening out distribution of the gas and obtaining good coating quality.

A critical aspect of the invention compared to earlier slot-moderated processes is that the effective coating deposition zone is much longer along the path of travel of the glass substrate 50. Thus, in the apparatus of FIG. 1, each reaction zone 30 results in a coating zone 60 of about 2 inches in width (or, defined with respect to the apparatus, about the distance between the center of each pair of reactant distribution tubes). The relatively low-pressure flow through the large ancillary-distribution slots, together with the gradually increasing width of the reaction zone, allows coating to be deposited in over a zone 60, i.e. the area not shielded from the reactants by the tube structure.

The flexibility of design approach is shown with Reference to FIG. 2 wherein, at each coating station, each of tubes 122 provide a first reactant gas and tube 112 provides a second reactant gas. The deflector means 114 must comprise two plates so that the reactants' gases are not allowed to mix until they reach the reaction zone at 118. As in the embodiment of FIG. 1, the wider, ancillary, distribution slots 126 and 116 are much wider than the premier distribution holes 144 and 124 as they allow the gasses to flow into the reaction zone 118, react, and deposit on substrate 150. Also, as in the embodiment of FIG. 1, the conduits 122 and 112 carrying the reactants into the apparatus form curved surfaces below the end of the deflector means 114 to allow a gradual widening of the reaction zone 118. This widening provides a wider effective coating zone at each coating station and also aids in smoother distribution of reactants as they move towards the heated glass substrate 150 to be coated.

A typical use of the apparatus of FIG. 2 is that disclosed in co-pending Application U.S. Ser. No. 443,340 wherein ammonia is reacted with titanium tetrachloride to form a titanium nitride film on the glass substrate. In such a process, ammonia reactant carried in an inert gas can be carried in tubes 122 while a titanium chloride vapor in an inert carrier gas is carried in tubes 112. Coolant can be circulated through tubes 132 which serve primarily as exhaust ducts.

Although such ducts are not shown in FIG. 1, it will be understood that such tubes as 132 are normally used with most coating stations according to the invention, including that shown in FIG. 1, to remove excess reactant or carrier gas. Also, depending upon the characteristics of the reactants, it will be understood that thermal insulation may be placed on reactant feed tubes, such as at 128, or that upper portions of the apparatus may be insulated as at 130. Moreover, such apparatus as described herein may be inverted and placed under a substrate to be coated. In such a case, the coating zones will be selected such that they do not interfere with the substrate support means.

It is also understood that the following claims are intended to cover all of the generic and specific features of the invention herein described and all statements of the scope of the invention which might be said to fall therebetween.

What is claimed is:

1. A process for forming a metal oxide coating by reacting a water vapor reactant and a metal halide reactant in close proximity to a moving glass substrate, comprising the steps of
   (a) primarily distributing said reactants through relatively small apertures spaced along tubes transverse to the direction of the glass substrate;
   (b) secondarily distributing said reactants through passages which are at least twice as wide as said aperture;
   (c) allowing said reactants to mix in a reaction zone at a position within a zone depth less than one inch from said substrate; and
   (d) depositing said coating onto said glass over a coating zone along said moving glass, the width of said coating zone being at least twice said zone depth.

2. A process as defined in claim 1 wherein one said reactant is a tin chloride reactant carried in, an inert carrier gas containing about 0.2 to 0.3 mole percent of oxygen and the other said reactant is water vapor carried in an inert carrier gas, also containing about 0.2 to 0.3 mole percent of oxygen.

3. A process as defined in claim 1 wherein said reaction zone gradually increases in width as it approaches said moving glass substrate.

4. A process as defined in claim 1 wherein said apertures are from about 0.1 to about 0.3 centimeters in diameter, are spaced about 2 to 3 centimeters apart across said glass plate and wherein said secondary distribution takes place through passages which are about three times as wide as the diameter of said apertures.

5. A process as defined in claim 1 wherein said reactants emerge generally upwardly from said small apertures and then flow downwardly through said passages into said reaction zone.

6. A process as defined in claim 3 wherein said reactants emerge generally upwardly from said small apertures and then flow downwardly through said passages into said reaction zone.

7. A process as defined in claim 4 wherein said reactants emerge generally upwardly from said small apertures and then flow downwardly through said passages into said reaction zone.

8. A process as defined in claim 7 wherein one said reactant is a tin chloride reactant carried in, an inert carrier gas containing about 0.2 to 0.3 mole percent of oxygen and the other said reactant is water vapor carried in an inert carrier gas, also containing about 0.2 to 0.3 mole percent of oxygen.

* * * * *